United States Patent
Madocks

(10) Patent No.: US 10,134,557 B2
(45) Date of Patent: Nov. 20, 2018

(54) LINEAR ANODE LAYER SLIT ION SOURCE

(71) Applicant: General Plasma, Inc., Tucson, AZ (US)

(72) Inventor: John E. Madocks, Tucson, AZ (US)

(73) Assignee: General Plasma, Inc., Tucson, AZ (US)

( * ) Notice: Subject to any disclaimer, the term of this patent is extended or adjusted under 35 U.S.C. 154(b) by 0 days.

(21) Appl. No.: 14/897,232

(22) PCT Filed: Jun. 12, 2014

(86) PCT No.: PCT/US2014/042187
§ 371 (c)(1),
(2) Date: Dec. 9, 2015

(87) PCT Pub. No.: WO2014/201292
PCT Pub. Date: Dec. 18, 2014

(65) Prior Publication Data
US 2016/0148775 A1    May 26, 2016

Related U.S. Application Data

(60) Provisional application No. 61/834,351, filed on Jun. 12, 2013.

(51) Int. Cl.
*H01J 27/14* (2006.01)
*H01J 27/10* (2006.01)
(Continued)

(52) U.S. Cl.
CPC ............ *H01J 27/14* (2013.01); *H01J 27/024* (2013.01); *H01J 27/10* (2013.01); *H01J 37/08* (2013.01)

(58) Field of Classification Search
CPC ........ H01J 27/14; H01J 27/143; H01J 27/146; H01J 27/10; H01J 27/024; H01J 37/08
See application file for complete search history.

(56) References Cited

U.S. PATENT DOCUMENTS 2,636,990 A   4/1953 Gow et al.
2,934,665 A   4/1960 Ziegler
(Continued)

OTHER PUBLICATIONS

Andrew Shabalin et al., White Paper—Industrial Ion Sources and Their Application for DLC Coating, Apr. 1999, 4 pages, Advanced Energy, SVC 42 Annual Technical Conference.
(Continued)

*Primary Examiner* — Sean Luck
(74) *Attorney, Agent, or Firm* — Grossman Tucker Perreault & Pfleger PLLC

(57) ABSTRACT

A linear anode layer ion source is provided that includes a top pole having a linear ion emitting slit. An anode under the top pole has a slit aligned with the top pole ion emitting slit. At least one magnet creates a magnetic field that passes through the anode slit. Wherein the width of the anode slit is 3 mm or less. A process of generating an accelerated ion beam is also provided that includes flowing a gas into proximity to said anode. By energizing a power supply electron flow is induced to the anode and the gas is ionized. Accelerating the ions from the anode through the linear ion emitting slit generates an accelerated ion beam by a process superior to that using a racetrack-shaped slit.

17 Claims, 4 Drawing Sheets

(51) Int. Cl.
*H01J 27/02* (2006.01)
*H01J 37/08* (2006.01)

(56) References Cited

U.S. PATENT DOCUMENTS

| | | | |
|---|---|---|---|
| 2,975,277 A | 3/1961 | Von Ardenne | |
| 2,978,580 A | 4/1961 | Von Ardenne | |
| 3,137,801 A | 6/1964 | Brooks et al. | |
| 3,164,739 A | 1/1965 | Werner | |
| 3,233,404 A | 2/1966 | Huber et al. | |
| 3,238,414 A | 3/1966 | Kelley et al. | |
| 3,315,125 A | 4/1967 | Fröhlich | |
| 3,340,425 A | 9/1967 | Kelley | |
| 3,408,283 A | 10/1968 | Chopra et al. | |
| 3,409,529 A | 11/1968 | Chopra et al. | |
| 3,494,852 A | 2/1970 | Doctoroff | |
| 3,513,351 A | 5/1970 | Kelley | |
| 3,535,880 A | 10/1970 | Work et al. | |
| 3,740,554 A | 6/1973 | Morgan, Jr. | |
| 4,316,090 A * | 2/1982 | Sakudo | H01J 27/18 250/423 R |
| 4,377,773 A | 3/1983 | Hershcovitch et al. | |
| 4,691,109 A | 9/1987 | Magee et al. | |
| 4,714,860 A | 12/1987 | Brown et al. | |
| 4,752,667 A | 6/1988 | Blanchard et al. | |
| 4,800,281 A | 1/1989 | Williamson | |
| 5,317,161 A | 5/1994 | Chalupka et al. | |
| 5,504,340 A | 4/1996 | Mizumura et al. | |
| 5,571,332 A | 11/1996 | Halpern | |
| 5,825,035 A | 10/1998 | Mizumura et al. | |
| 5,838,120 A * | 11/1998 | Semenkin | F03H 1/0075 250/396 R |
| 6,147,354 A * | 11/2000 | Maishev | H01J 27/02 250/423 R |
| 6,153,067 A * | 11/2000 | Maishev | C23C 14/228 204/298.04 |
| 6,236,163 B1 * | 5/2001 | Maishev | H01J 27/143 118/723 CB |
| 6,359,388 B1 * | 3/2002 | Petrmichl | C23C 14/221 250/423 R |
| 6,441,552 B1 | 8/2002 | Brandenburg et al. | |
| 6,734,434 B1 * | 5/2004 | Sainty | H01J 27/022 250/423 R |
| 7,009,342 B2 | 3/2006 | Minakov | |
| 7,122,966 B2 | 10/2006 | Norling et al. | |
| 7,312,579 B2 * | 12/2007 | Zhurin | H01J 27/146 250/423 R |
| 7,327,089 B2 * | 2/2008 | Madocks | H01J 27/146 118/723 DC |
| 7,411,352 B2 | 8/2008 | Madocks | |
| 7,755,062 B2 | 7/2010 | Yamashita et al. | |
| 7,791,041 B2 | 9/2010 | Yamashita et al. | |
| 8,134,287 B1 * | 3/2012 | Price | H01J 37/08 118/723 FI |
| 8,168,957 B2 | 5/2012 | Keller et al. | |
| 8,253,314 B2 | 8/2012 | Liu et al. | |
| 8,324,592 B2 | 12/2012 | Ryding et al. | |
| 8,633,452 B2 | 1/2014 | Graupera et al. | |
| 8,822,913 B2 | 9/2014 | Graupera et al. | |
| 9,388,490 B2 * | 7/2016 | Madocks | C23C 14/3407 |
| 9,406,487 B2 | 8/2016 | Crowley et al. | |
| 9,591,735 B2 | 3/2017 | Kellogg et al. | |
| 9,640,367 B2 | 5/2017 | Keller et al. | |
| 2002/0163289 A1 * | 11/2002 | Kaufman | H01J 27/146 313/361.1 |
| 2003/0230961 A1 * | 12/2003 | Madocks | F03H 1/0075 313/359.1 |
| 2004/0217713 A1 * | 11/2004 | Madocks | H01J 37/3405 315/111.41 |
| 2006/0177599 A1 * | 8/2006 | Madocks | C23C 14/32 427/569 |
| 2007/0273289 A1 * | 11/2007 | Burtner | H01J 27/146 315/111.91 |
| 2008/0017112 A1 * | 1/2008 | Murphy | H01J 27/024 118/723 FI |
| 2008/0136309 A1 * | 6/2008 | Chu | H01J 27/146 313/361.1 |
| 2008/0191629 A1 * | 8/2008 | Gutkin | H01J 3/20 315/111.61 |
| 2012/0187843 A1 * | 7/2012 | Madocks | H01J 27/143 315/111.41 |
| 2014/0184073 A1 * | 7/2014 | Crowley | H01J 37/3405 315/111.41 |
| 2016/0133426 A1 | 5/2016 | Madocks | |
| 2016/0148775 A1 | 5/2016 | Madocks | |

OTHER PUBLICATIONS

N. Oudini et al., Physics and modeling of an end-Hall (gridless) ion source, 2011, 12 pages, 109, 073310, Journal of Applied Physics.
Office Action dated May 9, 2018, issued in U.S. Appl. No. 14/897,229, 13 pages.
International Search Report and Written Opinion dated Oct. 28, 2014, issued in PCT Patent Application No. PCT/US2014/042187, 10 pages.
International Search Report and Written Opinion dated Oct. 29, 2014, issued in PCT Patent Application No. PCT/US2014/042176, 11 pages.
International Preliminary Report on Patentability dated Dec. 23, 2015, issued in PCT Patent Application No. PCT/US2014/042176, 8 pages.
International Preliminary Report on Patentability dated Dec. 23, 2015, issued in PCT Patent Application No. PCT/US2014/042187, 8 pages.
Office Action dated Oct. 6, 2017, issued in U.S. Appl. No. 14/897,229, 11 pages.
Mohamed E. Abdelaziz et al., A Study of a Duoplasmatron Ion Source with an Expansion Cup, UAR Atomic Energy Establishment, IEEE Transactions on Nuclear Science, Jun. 1967, 7 pages.
M.A. Abroyan et al., Duoplasmatron Parameters for Optimum Positive or Negative Ion Yield, Particle Accelerators, 1971 vol. 2, 7 pages.
V.A. Batalin et al., Duoplasmatron Type Source with Cold Cathode, IEEE Transactions on Nuclear Science, Apr. 1976, vol. NS-23, No. 2, 1 page.
G.W. Bennett et al., A Penning Discharge Ion Source for High Brightness, IEEE Transactions on Nuclear Science, Jun. 1967, 5 pages.
L.J. Christensen et al., High Current Duoplasmatron Ion Source with Ferrite Permanent Magnets, The Review of Scientific Instruments, Nov. 1966, vol. 37, No. 11, 4 pages.
W. Ensinger et al., Ion Beam Assisted Deposition with a duoplasmatron, The Review of Scientific Instruments, May 1992, vol. 63, No. 5, 6 pages.
John A Fasolo, A comparative Study of Drifting ARC and Extended Stationary ARC Duoplasmatrons, Argonne National Laboratory, Argonne, Illinois, date unknown, 11 pages, work performed under the auspices of the U.S. Atomic Energy Commision.
J.A. Fasolo, Studies of an Expanded Plasma Front Duoplasmatron Ion Source, IEEE Transactions on Nuclear Science, Jun. 1967, 7 pages.
A. Glazov et al., Pulsed Ion Sources of Duoplasmatron Type with Cold and Hot Cathodes, MRTI RAN, date unknown, 2 pages.
T. Ikejiri et al., Beam Uniformity Controllable Ion Source with a Long Slit, American Institute of Physics, 2008, 4 pages.
J. Illgen et al., Duoplasmatron Ion Sources, in den Baeumen Gesellachaft fuer Schwerionenforschung mbH, Darmstade, Germany, date unknown, 13 pages.
M.M. Abde Irahman, Factors Enhancing Production of Multicharged Ion Sources and Their Applications, Science and Technology, 2012, 2(4), 11 pages.
W. Knauer, Mechanism of the Penning Discharge at Low Pressures, Journal of Applied Physics, Jun. 1962, vol. 33, No. 6, 8 pages.
B.K. Kondrat'Ev et al., Generation of Continuous Ion Beams in a Duoplasmatron with a Cold Cathode, Instruments and Experimental Techniques, 2000, vol. 43, No. 6, 5 pages.

(56) References Cited

OTHER PUBLICATIONS

B.K. Kondrat'Ev et al., Operational Features of a Cold-Cathode Duoplasmatron in a Mode with a Small Pulse Off-Duty Factor, Instruments and Experimental Techniques, 2003, vol. 46, No. 1, 5 pages.
L. Pillatsch et al., Use of a Duoplasmatron Ion Source for Negative Ion Generation, Nuclear Instruments and Methods in Physics Research B 269, 2011, 5 pages.
B. Rout et al., Upgrading a Duoplasmatron Ion Source to Produce High Brightness Beam for Nuclear Microprobe Applications with a Tandem Accelerator, Nuclear Instruments and Methods in Physics Research B 241, 2005, 5 pages.
Joshua L. Rovey et al., Simple Penning Ion Source for Laboratory Research and Development Applications, Review of Scientific Instruments 78, 106101, 2007, 3 pages.
B.G. Safronov et al., Investigation of a Penning Discharge at Low Pressure, NASA Technical Translation, NASA TT F-15, 523, 1973, 16 pages.
D.L. Tang, Linear Ion Source with Magnetron Hollow Cathode Discharge, Review of Scientific Instruments 76, 113502, 2005, 4 pages.
B. Vosicki et al. The Duoplasmatron Source for the Cern-PC Linac, Proceedings of the 1966 Linear Accelerator conference, Los Alamos, New Mexico, USA, 11 pages.
H. Winter, Development of a Plasmatron Ion Source for an Electro-Magnetic Isotope Separator, International Journal of Mass Spectrometry and Ion Physics, vol. 6, 1971, 8 pages.

\* cited by examiner

LINEAR ANODE LAYER SLIT ION SOURCE

RELATED APPLICATIONS

This application claims priority benefit of U.S. Provisional Application Ser. No. 61/834,351 filed Jun. 12, 2013; the contents of which are hereby incorporated by reference.

FIELD OF THE INVENTION

The present invention relates in general to ion sources and in particular to ion sources for industrial applications and ion thrusters for space travel.

BACKGROUND OF THE INVENTION

The anode layer ion sources are well known having been implemented in industrial applications and ion thrusters for many decades. FIG. 1 shows a 3D view of a prior art anode layer ion source and FIG. 1A shows a section view of this prior art ion source. As shown in FIG. 1, the ion emitting racetrack of an anode layer ion sources can be extended in one axis to have long straight-away sections. In practice, these sources have been made several meters long. This is possible because electrons are confined in an endless closed drift around the racetrack. The closed drift electron confinement produces a uniform discharge around the racetrack and subsequently a uniform ion beam 113 is emitted from the slit 112. As shown in FIG. 1A, the prior art anode layer ion source creates the closed drift confinement using magnet 101, center pole 131 and outer pole 130 such that magnetic field 115 crosses from the center pole to outer pole around the racetrack 112. An annular anode 102 is positioned under the poles and power supply 114 generates the electric field to operate the source. In long ion sources, source gas 107 must be distributed along the length of the source. This is shown for source 100 as manifold 106 and distribution holes 110. An anode layer ion source is differentiated from other closed drift ion sources by the spacing of the gap between the center and outer poles and the gap between the poles and the anode. In an anode layer ion source, these gaps are made small, on the order of 2-3 mm so that the electron confinement region is too small for a conductive plasma to light. In this way an anode layer ion source can be operated in a collimated, high voltage mode. In the collimated mode, the anode voltage can be in the 1000's of volts and the emitted ions are efficiently directed out of the source. If the gaps are larger, a conductive plasma can be sustained in slit 112 and the electric fields shift around this plasma. In this so called 'diffuse' mode, pole sputtering is considerable and the maximum source voltage drops down to typical closed drift ion sources, in the 100's of volts. While operating in the diffuse mode can be useful, the design of anode layer ion sources and suggested operating parameters are intended to keep the sources running in the collimated mode. It is important to note that the gas pressure in the slit is also important to the operating mode. If the pressure is too high, and the resulting mean free path too short, an anode layer ion source can operate in the diffuse mode even if the pole gaps are small. Typically, to avoid diffuse mode operation, anode layer ion sources are operated at less than 1 Pa for this reason.

While prior art anode layers sources are useful, the racetrack shape of the ion emitting slit is not ideal. When the racetrack ion beam is directed at an angle to a substrate, the two parallel straightaway beams of the racetrack hit the substrate after different travel distances. Given there are collisional energy losses as ions travel to the substrate, a longer travel distance lowers the ion beam energy and the two straight-away beams hit the substrate at different energies. Additionally, the chamber space needed to fit the angled ion source and racetrack beam is larger than desired.

Thus, there exists a need for linear ion emitting slit ion source to overcome the limitations of the racetrack-shaped slit ion source.

SUMMARY OF THE INVENTION

A linear anode layer ion source is provided that includes a top pole having a linear ion emitting slit. An anode under the top pole has an anode slit that is aligned with the top pole ion emitting slit. The ion source has at least one magnet to create a magnetic field passing through the anode slit. Where the width of the anode slit is less than 3 mm A process of generating an accelerated ion beam is also provided that includes flowing a gas into proximity to the anode slit. By energizing a power supply electron flow is induced to the anode and the gas is ionized. Accelerating the ions from the anode through the linear ion emitting slit generates an accelerated ion beam by a process superior to that using a racetrack-shaped slit.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE PREFERRED EMBODIMENTS

The present invention has utility as an ion source for industrial applications and space propulsion. All prior art anode layer ion sources have a round or annular racetrack shaped ion dispensing slit. The inventive anode layer slit ion source is termed synonymously a 'Lineatron' herein. Within the Lineatron slit, a novel configuration of magnetic and electric fields produces an efficient, closed drift electron containment that creates a uniform linear ion beam over the length of the slit. The result is the Lineatron is an improved anode layer ion source that has several advantages over prior art ion sources.

It is to be understood that in instances where a range of values are provided that the range is intended to encompass not only the end point values of the range but also intermediate values of the range as explicitly being included within the range and varying by the last significant figure of the range. By way of example, a recited range of from 1 to 4 is intended to include 1-2, 1-3, 2-4, 3-4, and 1-4.

With reference to alignment, two elements are considered align spatial according to the present invention if within 20 percent of being concentric, while angular alignment is with 10 degrees.

Figure 1:
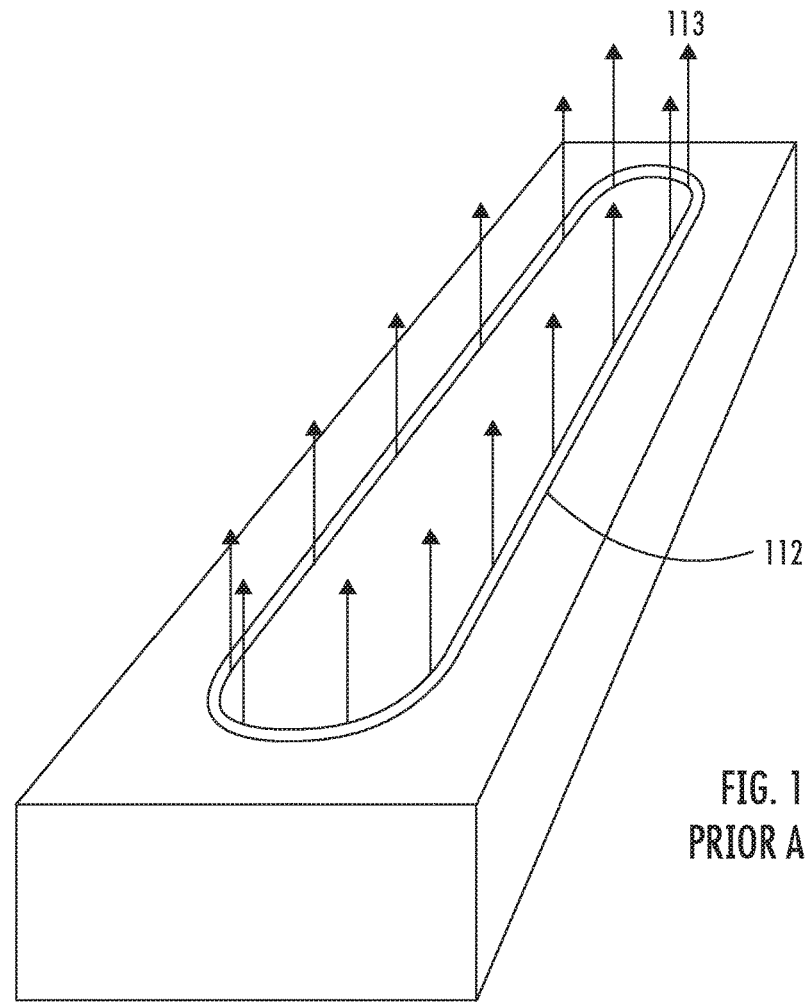
FIG. 1 shows a 3D view of a prior art anode layer ion source.
Figure 1A:
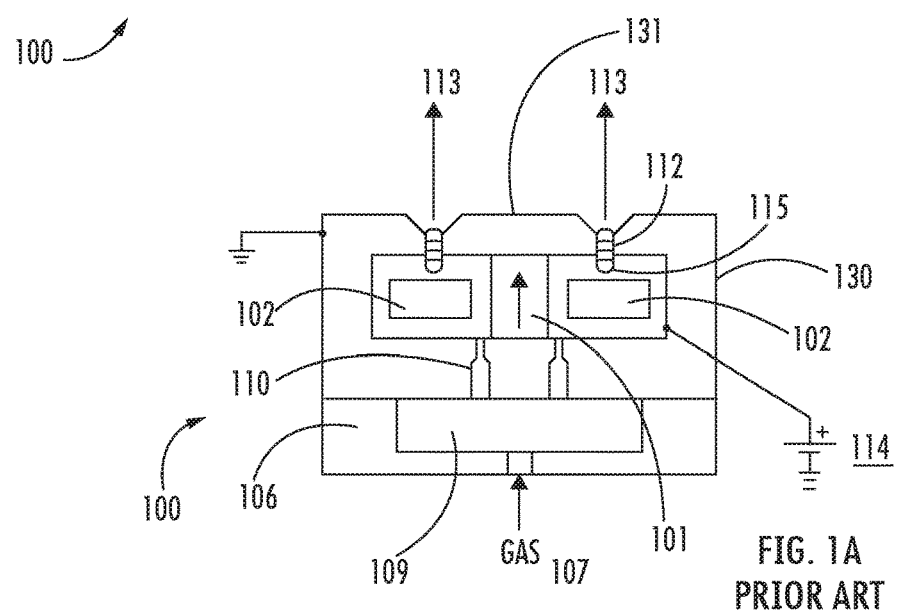
FIG. 1A shows a section view of a prior art anode layer ion source.
Figure 2:
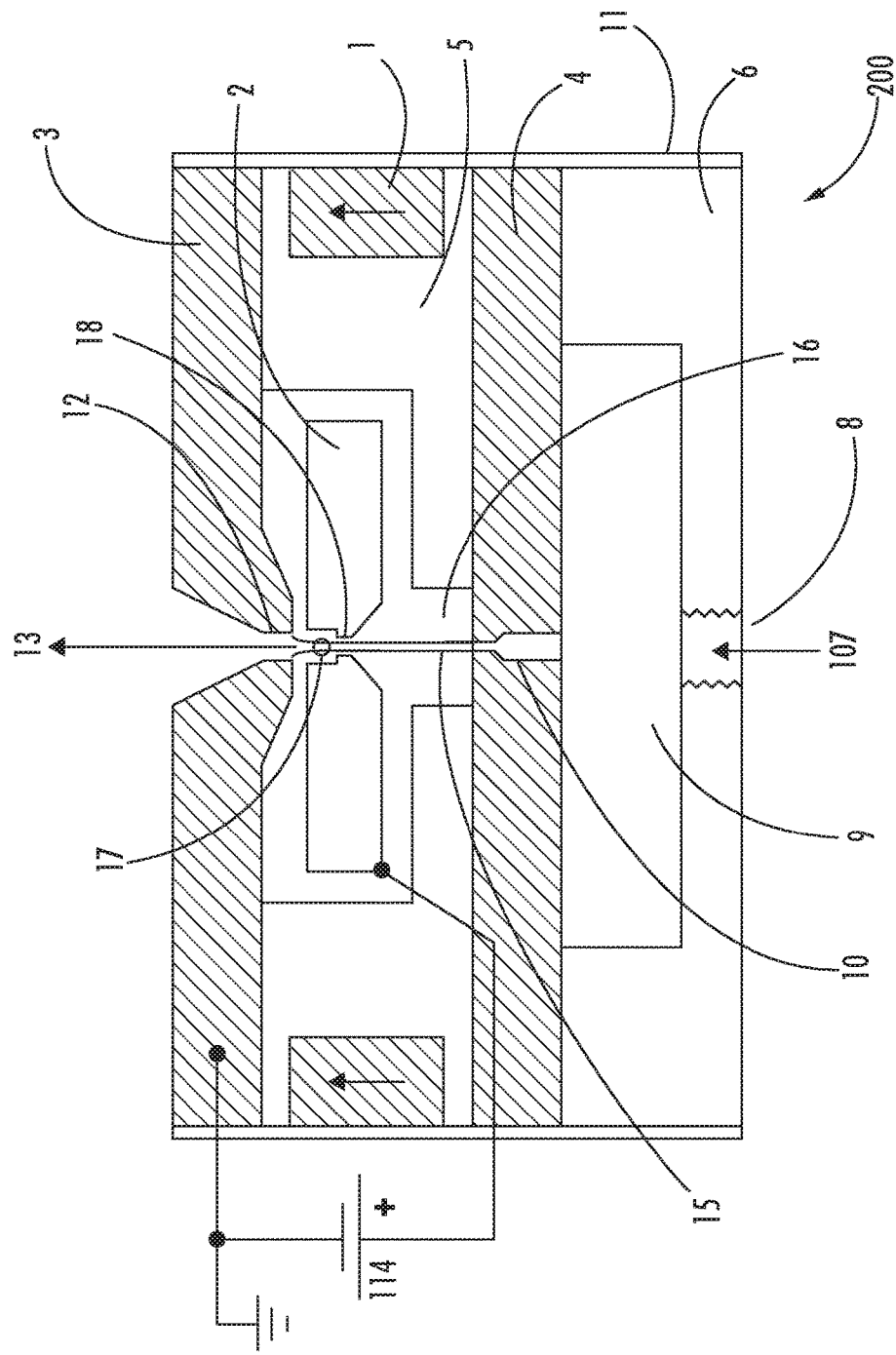
FIG. 2 shows a section view of an anode layer slit ion source (Lineatron)
Figure 3:
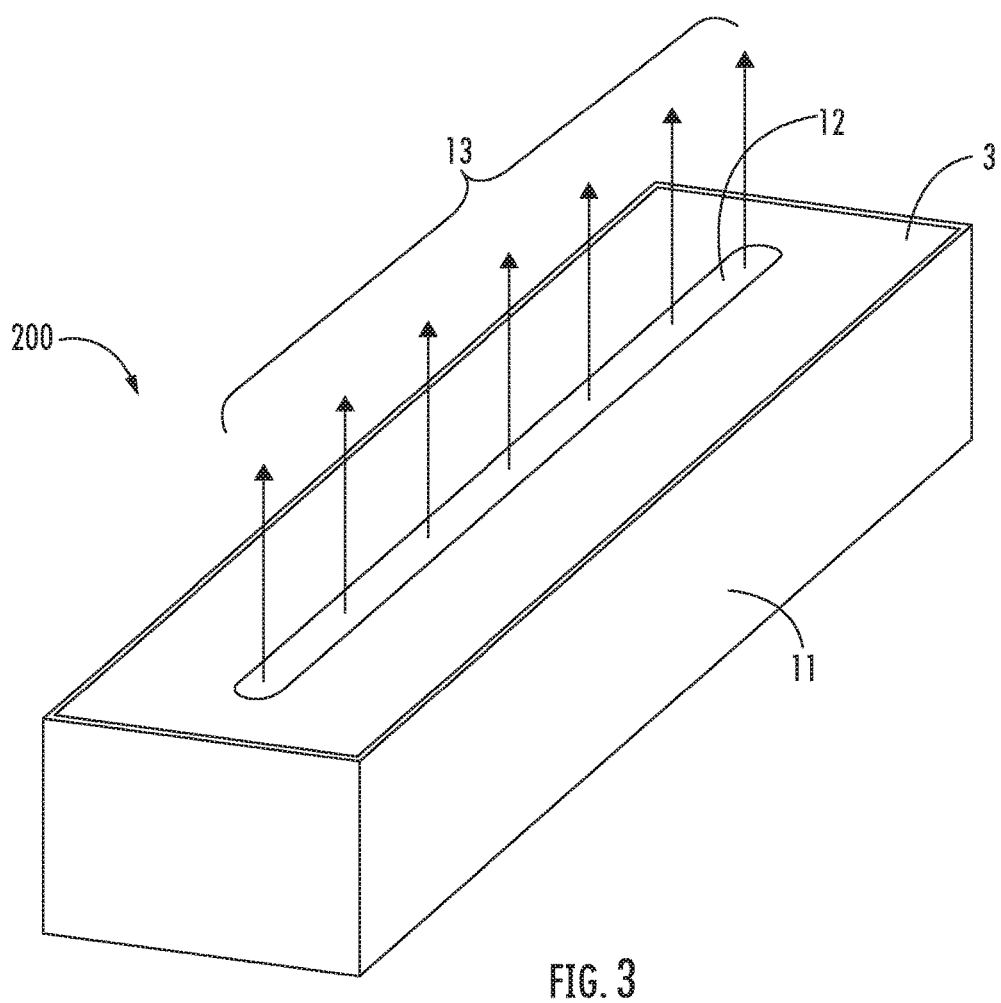
FIG. 3 shows a 3D view of the Lineatron ion source.
Figure 4:
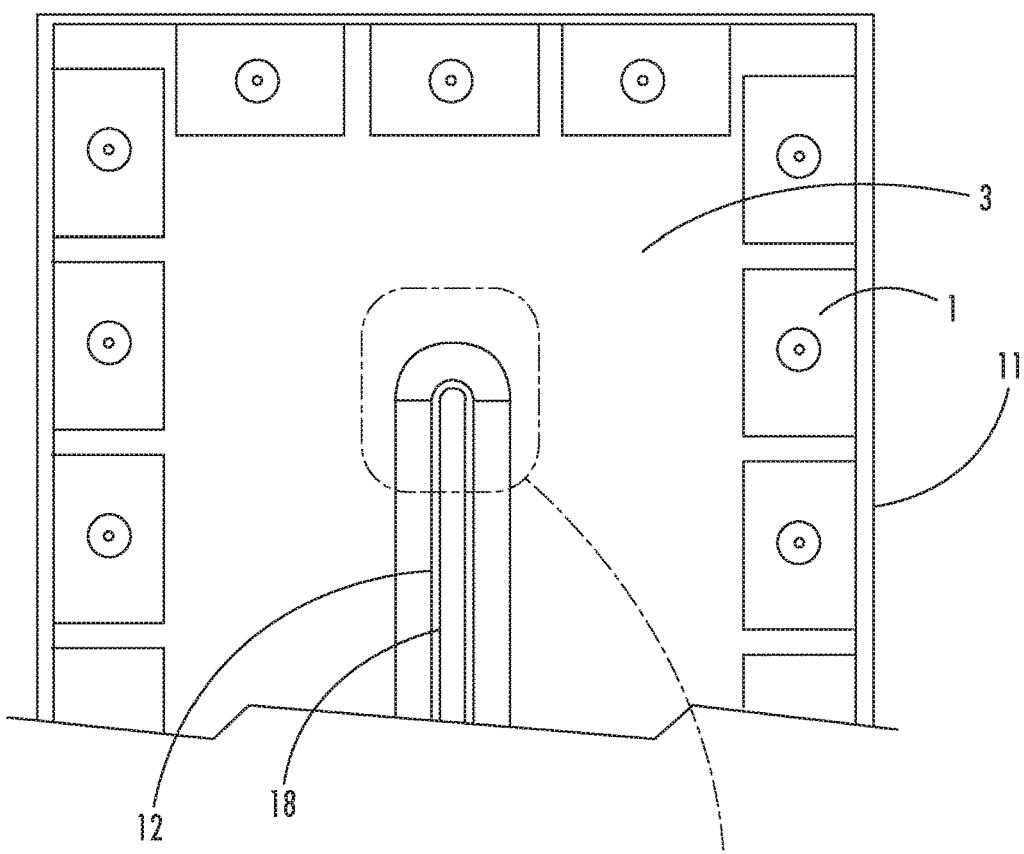
FIG. 4 shows a top view of the Lineatron ion source.

FIG. 2 is a section view of an anode layer slit ion source 200. A 3D view of Lineatron 200 is shown in FIG. 3. Unlike prior art anode layer ion sources, Lineatron 200 has a single straight ion dispensing slit 12. In Lineatron 200, top pole 3 is a single piece of magnetically permeable metal such as low carbon steel. Slit 12 is machined in the center of this top pole 3. Permanent magnets 1 are arrayed around pole 3 as shown in FIG. 4. (Note that FIG. 4 shows the magnets 1 through top pole 3 and core 5.) Neodymium iron rare earth is a good choice for the magnet material as they are strong and low cost. Other magnet materials such as samarium cobalt can be used. Magnets 1 are inserted into pockets in aluminum core 5. Bottom pole 4 is a rectangular plate fabricated of low carbon steel. With this configuration, a magnetic field 15 is created in the slit between top pole 3 and bottom pole 4. Unlike prior art anode layer sources, the magnetic field lines 15 in slit 12 are generally in axial alignment with ion flow out of the source. As the magnetic field lines 15 pass between the top pole 3 and bottom pole 4, they pass through a slit 18 in anode 2. Anode 2 slit is aligned to be concentric to top pole slit 12. Anode 2 is electrically isolated from core 5 and top pole 3 by insulators not shown. In certain inventive embodiments, all other source parts are at ground potential.

Source gas 7 is directed through hole 8 and into region 9 of gas manifold 6. Gas 7 then flows through distributed holes 10 in bottom pole 4 and into the gap 16 between bottom pole 4 and anode 2. Side plates 11, made of aluminum, cover the sides and ends of source and secure and protect magnets 1. Core 5 is water cooled (not shown) by known methods. High voltage power supply 14 is connected between anode 2 and ground. As shown in FIG. 3, Lineatron 200 is a linear ion source with a slit length of 400 mm. Slit lengths ranging from 50 mm to greater than 3 meters are constructed according to the present invention.

Figure 5:
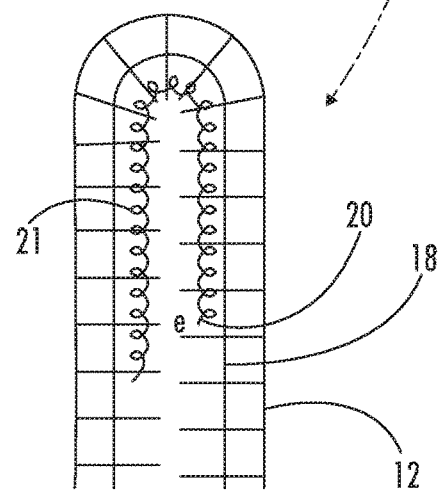
FIG. 5 illustrates the Hall current drift in the inventive Lineatron ion source slit.

When power supply 14 is turned on and with gas 7 flowing, an electrical discharge is ignited and ions are generated in region 17 and are accelerated out of slit 12. Electrons are trapped in a closed drift confinement between top pole 3 and bottom pole 4. FIG. 5 shows a detail view looking down into slit 12 in top pole 3. This view illustrates how electrons are trapped in an endless closed drift in a linear slit. FIG. 4 shows magnetic field lines 15 leaving top pole slit 12 and passing down to bottom pole 4. Anode slit 18 is narrower than top pole slit 12 and can be seen below slit 12 in this view. Note that anode slit width 18 can be larger than, equal to or narrower than top pole slit 12. The important criteria is that the anode slit width is sufficiently narrow that a conductive plasma does not light. To meet this criteria, the anode slit 18 width should be less than 3 mm, with 1-1.5 mm being preferable. The width of top pole slit 12 is more forgiving but generally should be less than 6 mm. In depicted source 200, the top pole slit 12 width is 3 mm and the anode slit 18 width is 1.5 mm. After discharge ignition, electrons trying to reach anode 2 are impeded from crossing magnetic field lines 16. The E×B forces, where E is the electric field, B is the magnetic field and E×B denotes the cross product therebetween acting on the electrons 20 results in a cycloidal, Hall direction drift 21. Note that magnetic field lines 15 pass out of slit 12 face and down to bottom pole 4 at the ends of the slit just as they do along the straightaway. In this way, electrons 20 are captured in a continuous closed drift racetrack within the source slit and between top pole 3 and bottom pole 4. Ions 13 are created in the anode slit 18 near the surface of the anode 2, in the so called 'anode layer' region 17. These newly created ions experience a strong electric field between the top pole 3 and anode 2 and are accelerated out of the slit 12. By locating anode slit 18 closer to the top pole 3 than bottom pole 4, the E field is stronger toward the top pole 3 and ions preferentially exit the source through slit 12.

Although the present invention has been described with reference to preferred embodiments, numerous modifications and variations can be made and still the result will come within the scope of the invention. No limitation with respect to the specific embodiments disclosed herein is intended or should be inferred.

What is claimed is:

1. A system, comprising:
   a linear anode layer ion source, the linear anode layer ion source comprising:
   a top pole having a top pole ion emitting slit;
   an anode under said top pole, said anode having an anode slit aligned with the top pole ion emitting slit;
   at least one magnet to create a magnetic field comprising magnetic field lines that pass through said anode slit;
   wherein:
   the anode slit has a first end and a second end, a width less than 3 mm, and a length from the first end to the second end that is greater than or equal to 50 mm; and
   in operation, an ion flow flows from the top pole ion emitting slit.

2. The system of claim 1, wherein:
   said linear anode layer ion source further comprises a bottom pole;
   said bottom pole is positioned under said anode; and
   the magnetic field lines pass between said bottom pole and said top pole, and through said anode slit.

3. The system of claim 1, wherein said top pole ion emitting slit has a width that is less than or equal to 6 mm.

4. The system of claim 1 wherein said anode slit has a length that is greater than or equal to 300 mm.

5. The system of claim 1, wherein said top pole ion emitting slit is round or annular.

6. The system of claim 1, wherein the magnetic field lines within the top pole ion emitting slit and are in axial alignment with the ion flow.

7. The system of claim 1, wherein said anode slit is narrower than said top pole ion emitting slit.

8. The system of claim 1, wherein said anode slit is concentric with said top pole ion emitting slit.

9. The system of claim 1, wherein said anode slit is concentric with said top pole ion emitting slit.

10. The system of claim 2 wherein the bottom pole is farther away from the anode slit than the top pole.

11. The system of claim 3, wherein within the top pole ion emitting slit, the magnetic field lines are in axial alignment with the ion flow.

12. The system of claim 4, wherein within the top pole ion emitting slit, the magnetic field lines are in axial alignment with the ion flow.

13. The system of any claim 5 wherein within the top pole ion emitting slit, said magnetic field lines are in axial alignment with the ion flow.

14. A process for generating an accelerated ion beam comprising:

flowing a gas into proximity of an anode slit of a linear anode layer ion source, the linear anode layer ion source comprising:
   a top pole having a top pole ion emitting slit;
   an anode comprising said anode slit, wherein:
      said anode is under said top pole with the anode slit aligned with the top pole ion emitting slit;
      said anode slit has a first end and a second end, a width less than 3 mm, and a length from the first end to the second end that is greater than or equal to 50 mm; and
   at least one magnet to generate a magnetic field comprising field lines that pass through said linear anode slit;
energizing a power supply to induce electron flow to said anode and ionize the gas to form ions; and
accelerating the ions from said anode through the top pole ion emitting slit to generate an ion flow from said top pole ion emitting slit.

15. The process of claim 14, wherein said linear anode layer ion source further comprises a bottom pole under said anode, and the method further comprises trapping electrons in a closed drift confinement between said top pole and said bottom pole.

16. The method of claim 14, wherein said linear anode slit is narrower than said top pole ion emitting slit.

17. The method of claim 15, wherein within the top pole ion emitting slit, magnetic field lines of the magnetic field are in axial alignment with said ion flow.

* * * * *